(12) United States Patent
Song (10) Patent No.: US 12,374,411 B2
(45) Date of Patent: Jul. 29, 2025

(54) THREE-DIMENSIONAL FLASH MEMORY FOR IMPROVING INTEGRATION AND OPERATION METHOD THEREOF

(71) Applicant: Samsung Electronics Co., LTD., Suwon-si (KR)

(72) Inventor: Yun Heub Song, Seoul (KR)

(73) Assignee: Samsung Electronics Co., LTD., Suwon-si (KR)

( * ) Notice: Subject to any disclaimer, the term of this patent is extended or adjusted under 35 U.S.C. 154(b) by 68 days.

(21) Appl. No.: 18/249,942

(22) PCT Filed: Sep. 28, 2021

(86) PCT No.: PCT/KR2021/013261
§ 371 (c)(1),
(2) Date: Apr. 20, 2023

(87) PCT Pub. No.: WO2022/085967
PCT Pub. Date: Apr. 28, 2022

(65) Prior Publication Data
US 2023/0410919 A1    Dec. 21, 2023

(30) Foreign Application Priority Data

Oct. 20, 2020  (KR) .......... 10-2020-0135720
Nov. 17, 2020  (KR) .......... 10-2020-0153274

(51) Int. Cl.
*G11C 11/418*     (2006.01)
*G11C 16/04*      (2006.01)
(Continued)

(52) U.S. Cl.
CPC ...... *G11C 16/3427* (2013.01); *G11C 16/0483* (2013.01); *G11C 16/10* (2013.01);
(Continued)

(58) Field of Classification Search
CPC .................................................. G11C 11/418
See application file for complete search history.

(56) References Cited

U.S. PATENT DOCUMENTS 8,872,253 B2   10/2014  Lee
9,449,985 B1    9/2016  Rabkin et al.
(Continued)

FOREIGN PATENT DOCUMENTS

JP   2010-048602 A   3/2010
JP   2016051486      4/2016
(Continued)

OTHER PUBLICATIONS

International Search Report for International Application No. PCT/KR2021/013261, mailed Jan. 12, 2022 (5 pages).
(Continued)

*Primary Examiner* — Jason Lappas
(74) *Attorney, Agent, or Firm* — Fish & Richardson P.C.

(57) ABSTRACT

Disclosed are a three-dimensional flash memory, to which a GSL-removed structure is applied, and an operating method thereof.

According to an embodiment, the three-dimensional flash memory comprises: a plurality of word lines which are formed extending in a horizontal direction on a substrate and are sequentially stacked; and a plurality of strings passing through the plurality of word lines and formed extending in one direction on the substrate, wherein each of the plurality of strings comprises a channel layer formed extending in the one direction and a charge storage layer formed extending in the one direction to surround the channel layer, and the channel layer and the charge storage layer constitute a plurality of memory cells corresponding to the plurality of word lines, and the channel layer comprises a back gate formed extending in the one direction while at least a part thereof is surrounded by the channel layer and an insulation (Continued)

film formed extending in the one direction between the back gate and the channel layer, and each of the plurality of strings includes the back gate. Accordingly, the three-dimensional flash memory has a GSL-removed structure.

8 Claims, 11 Drawing Sheets

(51) Int. Cl.
    *G11C 16/10*     (2006.01)
    *G11C 16/16*     (2006.01)
    *G11C 16/26*     (2006.01)
    *G11C 16/34*     (2006.01)
    *H10B 41/27*     (2023.01)
    *H10B 43/27*     (2023.01)

(52) U.S. Cl.
    CPC .............. *G11C 16/16* (2013.01); *G11C 16/26* (2013.01); *H10B 41/27* (2023.02); *H10B 43/27* (2023.02); *G11C 11/418* (2013.01)

(56) References Cited

U.S. PATENT DOCUMENTS

| | | |
|---|---|---|
| 9,627,094 B2 | 4/2017 | Yano |
| 9,978,644 B1 | 5/2018 | Rinne |
| 10,340,284 B2 | 7/2019 | Kim et al. |
| 11,088,162 B2 | 8/2021 | Fujii et al. |
| 11,282,853 B2 | 3/2022 | Sotome et al. |
| 2020/0168630 A1 | 5/2020 | Borukhov |
| 2020/0183791 A1* | 6/2020 | Park .................. G06F 11/1458 |
| 2020/0321349 A1 | 10/2020 | Kwon et al. |

FOREIGN PATENT DOCUMENTS

| | | |
|---|---|---|
| JP | 2017-021872 A | 1/2017 |
| JP | 2020-035974 A | 3/2020 |
| JP | 2020-150234 A | 9/2020 |
| KR | 10-2012-0130902 A | 12/2012 |
| KR | 1020140148129 | 12/2014 |
| KR | 10-2019-0005293 A | 1/2019 |
| KR | 1019461790000 | 1/2019 |
| KR | 1020200116795 | 10/2020 |
| KR | 1023684350000 | 2/2022 |

OTHER PUBLICATIONS

Office Action in Korean Appln. No. 10-2020-0135720, mailed on Jun. 29, 2023, pages (with English translation).

Office Action in Korean Appln. No. 10-2020-0153274, mailed on Jun. 26, 2023, 5 pages (with English translation).

* cited by examiner

THREE-DIMENSIONAL FLASH MEMORY FOR IMPROVING INTEGRATION AND OPERATION METHOD THEREOF

TECHNICAL FIELD

The following embodiments relate to a three-dimensional (3D) flash memory, and more specifically, a 3D flash memory with improved integration and a method for operating the same.

BACKGROUND ART

A flash memory device is an electrically erasable programmable read only memory (EEPROM), and the memory may be commonly used in, for example, a computer, digital camera, MP3 player, game system, or memory stick. Such a flash memory device electrically controls input/output of data by Fowler-Nordheim tunneling or hot electron injection.

Figure 1:
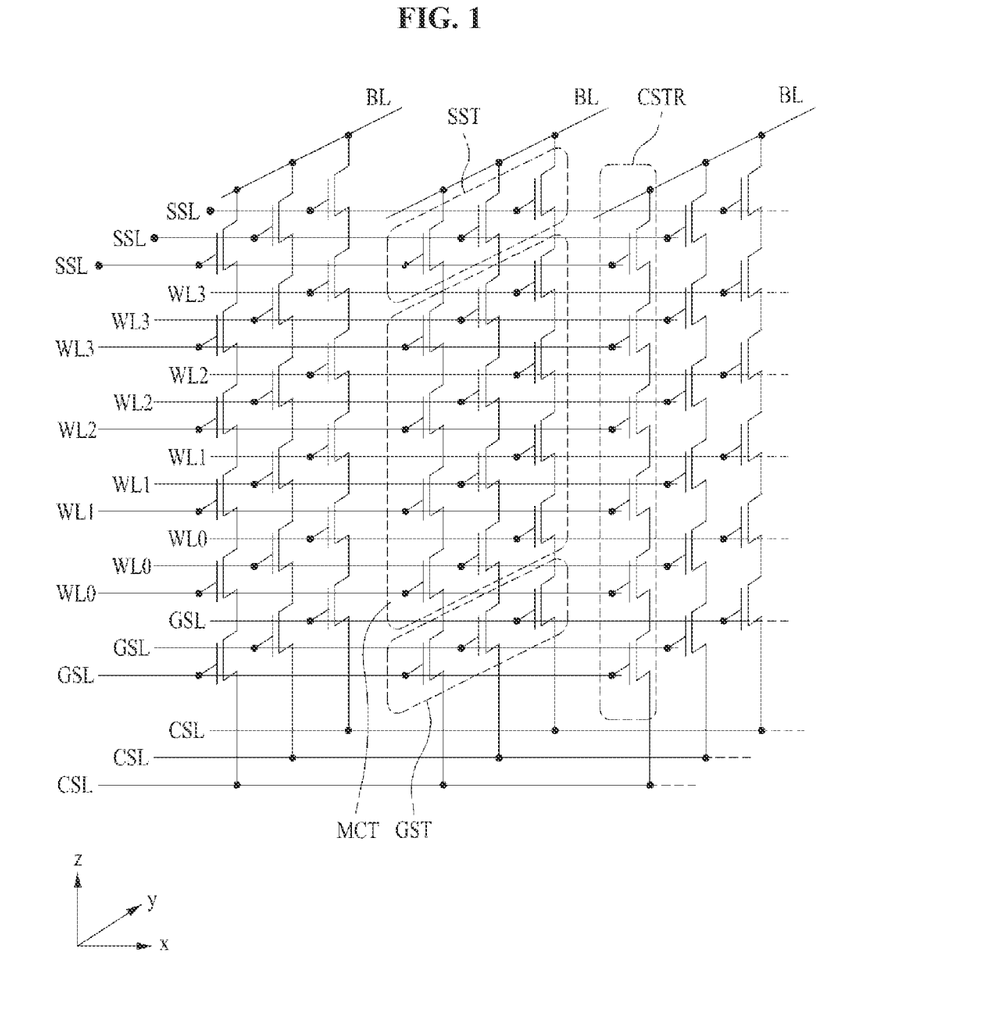
FIG. 1 is a simplified circuit diagram showing an array of a conventional three-dimensional flash memory.

Specifically, referring to FIG. 1 showing a conventional 3D flash memory array, the 3D flash memory array includes common source lines CSL, bit lines BL, and a plurality of cell strings CSTR disposed between the common source lines CSL and the bit lines BL.

The bit lines are two-dimensionally arranged, and the plurality of cell strings CSTR are connected in parallel to each of the bit lines. The cell strings CSTR may be commonly connected to the common source line CSL. That is, the plurality of cell strings CSTR may be disposed between a plurality of bit lines and one common source line CSL. In this case, the number of common source lines CSL may be plural, and the plurality of common source lines CSL may be two-dimensionally arranged. Here, electrically the same voltage may be applied to the plurality of common source lines CSL, or each of the plurality of common source lines CSL may be electrically controlled.

Each of the cell strings CSTR may include a ground selection transistor GST connected to each of the common source lines CSL, a string selection transistor SST connected to the bit line BL, and a plurality of memory cell transistors MCT disposed between the ground selection transistor GST and the string selection transistor SST. Also, the ground selection transistor GST, the string selection transistor SST, and the memory cell transistors MCT may be connected in series.

The common source line CSL may be commonly connected to sources of the ground selection transistors GST. In addition, a ground selection line GSL, a plurality of word lines WL0 to WL3, and a plurality of string selection lines SSL disposed between the common source line CSL and the bit line BL may be used as electrode layers of the ground selection transistor GST, the memory cell transistors MCT, and the string selection transistors SST, respectively. Also, each of the memory cell transistors MCT includes a memory element. Hereinafter, the string selection line SSL may be referred to as an upper selection line USL, and the ground selection line GSL may be referred to as a lower selection line LSL.

On the other hand, a conventional 3D flash memory has an increasing integration by vertically stacking cells in order to meet the excellent performance and low price required by consumers.

Figure 2:
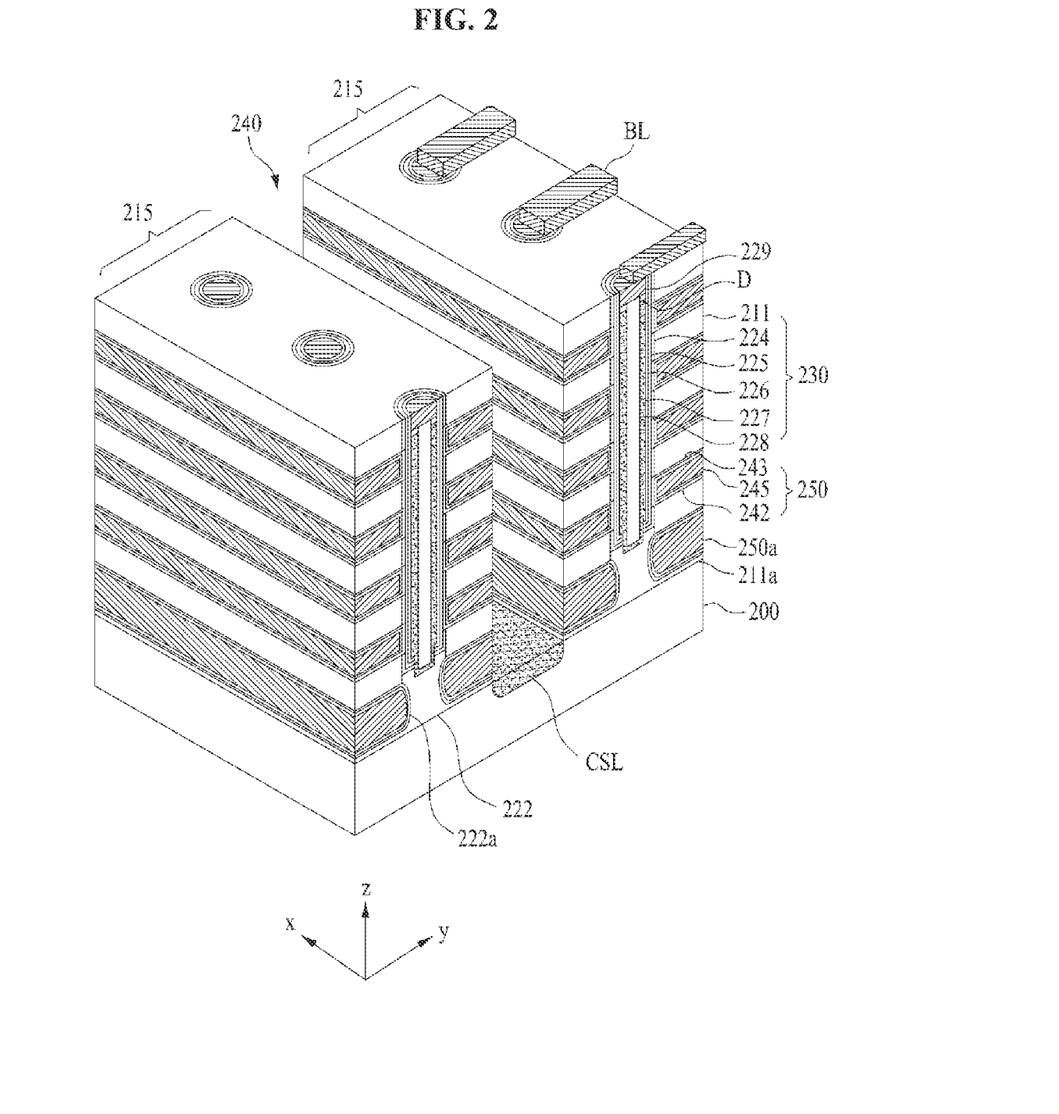
FIG. 2 is a perspective view showing a structure of a conventional three-dimensional flash memory.

For example, referring to FIG. 2 showing the structure of a conventional 3D flash memory, the conventional 3D flash memory is manufactured in such a way that electrode structures 215, in which interlayer insulating layers 211 and horizontal structures 250 are alternately and repeatedly formed, are disposed on a substrate 200. The interlayer insulating layers 211 and the horizontal structures 250 may extend in the first direction. The interlayer insulating layers 211 may be, for example, a silicon oxide film, and a lowermost interlayer insulating layer 211a among the interlayer insulating layers 211 may have a smaller thickness than the remaining interlayer insulating layers 211. Each of the horizontal structures 250 may include first and second blocking insulating films 242 and 243 and an electrode layer 245. A plurality of electrode structures 215 is provided and the plurality of electrode structures 215 may be disposed to face each other in a second direction crossing a first direction. The first and second directions may correspond to the x-axis and the v-axis of FIG. 2, respectively. Trenches 240 spacing the plurality of electrode structures 215 may extend in the first direction between the plurality of electrode structures 215. Highly doped impurity regions may be formed in the substrate 200 exposed by the trenches 240 and the common source line CSL may be disposed therein. Although not shown, isolation insulating layers filling the trenches 240 may be further disposed.

Vertical structures 230 passing through the electrode structure 215 may be disposed. For example, the vertical structures 230 may be arranged in a matrix form by being arranged along the first and second directions when viewed from a plan view. As another example, the vertical structures 230 may be arranged in the second direction and may be arranged in a zigzag pattern in the first direction. Each of the vertical structures 230 may include a passivation film 224, a charge storage film 225, a tunnel insulating film 226, and a channel layer 227. For example, the channel layer 227 may be disposed in a hollow tube, and in this case, a filling film 228 filling the inside of the channel layer 227 may be further disposed. A drain region D is disposed on the channel layer 227, and a conductive pattern 229 is formed on the drain region D and connected to the bit line BL. The bit line BL may extend in a direction crossing the horizontal electrodes 250, for example, in the second direction. For example, the vertical structures 230 arranged in the second direction may be connected to one bit line BL.

The first and second blocking insulating films 242 and 243 included in the horizontal structures 250, and the charge storage film 225 and the tunnel insulating film 226 included in the vertical structures 230 may be defined as an Oxide-Nitride-Oxide (ONO) layer, which is an information storage element of the 3D flash memory. That is, some of the information storage elements may be included in the vertical structures 230 and the remaining information storage elements may be included in the horizontal structures 250. For example, among the information storage elements, the charge storage film 225 and the tunnel insulating layer 226 may be included in the vertical structures 230, and the first and second blocking insulating films 242 and 243 may be included in the horizontal structures 250.

Epitaxial patterns 222 may be disposed between the substrate 200 and the vertical structures 230. The epitaxial patterns 222 connect the substrate 200 and the vertical structures 230. The epitaxial patterns 222 may be in contact with the horizontal structures 250 of at least one layer. That is, the epitaxial patterns 222 may be disposed to be in contact with the lowermost horizontal structure 250a. According to another embodiment, the epitaxial patterns 222 may be disposed to be in contact with the horizontal structures 250 of a plurality of layers, for example, two layers. Meanwhile, when the epitaxial patterns 222 are disposed to be in contact with the lowermost horizontal structure 250a, the lowermost horizontal structure 250a may be thicker than the remaining the horizontal structures 250. The lowermost horizontal structure 250a in contact with the epitaxial patterns 222 may correspond to the ground selection line GSL of the 3D flash memory array described with reference to FIG. 1, and the remaining horizontal structures 250 in contact with the remaining horizontal structures 250 may correspond to the plurality of word lines WL0 to WL3.

Each of the epitaxial patterns 222 has a recessed sidewall 222a. Accordingly, the lowermost horizontal structure 250a in contact with the epitaxial patterns 222 is disposed along the profile of the recessed sidewall 222a. That is, the lowermost horizontal structure 250a may be disposed to be inwardly convex along the recessed sidewall 222a of the epitaxial patterns 222.

The conventional 3D flash memory having the above-described structure has a structure including a plurality of GSLs in order to solve a channel leakage current while securing a channel potential in a non-selected string during a program operation.

However, in this case, the conventional 3D flash memory has a disadvantage in that the degree of memory integration is lowered.

Accordingly, the following embodiments propose a technique for securing channel potential in a non-selected string, solving channel leakage current, and improving memory integration.

DETAILED DESCRIPTION OF THE INVENTION

Technical Problem

Embodiments propose a 3D flash memory to which a GSL removal structure is applied and an operating method thereof in order to secure channel potential in a non-selected string, solve a channel leakage current, and improve memory integration.

Technical Solution

According to an embodiment, a three-dimensional flash memory includes a plurality of word lines which are formed by extending in a horizontal direction on a substrate and are sequentially stacked, and a plurality of strings passing through the plurality of word lines and formed by extending in one direction on the substrate, wherein each of the plurality of strings comprises a channel layer formed by extending in the one direction and a charge storage layer formed by extending in the one direction to surround the channel layer, and the channel layer and the charge storage layer constitute a plurality of memory cells corresponding to the plurality of word lines, and the channel layer comprises a back gate formed by extending in the one direction while at least a part thereof is surrounded by the channel layer and an insulation film formed by extending in the one direction between the back gate and the channel layer, and wherein the three-dimensional flash memory has a structure in which a ground selection line (GSL) is removed as each of the plurality of strings includes the back gate.

According to an aspect, a word line located at a lowermost end among the plurality of word lines may form a part of a dummy word line or memory cell word lines.

According to another aspect, the word line located at the lowermost end among the plurality of word lines may be in an ON state at all times during memory operation when being used as the dummy word line.

According to still another aspect, the word line located at the lowermost end among the plurality of word lines may be supplied with a program voltage for a program operation when the word line is a word line of a target memory cell that is a target of the program operation during the program operation of the 3D flash memory, be floated when the word line is not the word line of the target memory cell subject to the program operation during the program operation, be supplied with a Gate-Induced Drain Leakage (GIDL) voltage for causing a GIDL phenomenon during an erase operation of the 3D flash memory, be supplied with a read voltage for a read operation when the word line is a word line of a target memory cell subject to the read operation and be supplied with a pass voltage when the word line is not the word line of the target memory cell subject to the read operation.

According to still another aspect, in the word line located at the lowermost end among the plurality of word lines, a hole supply film for supplying holes in an erase operation is disposed.

According to still another aspect, in an area corresponding to at least one String Selection Line (SSL) located above the plurality of word lines in each of the plurality of strings, the hole supply film for supplying the holes in the erase operation is disposed.

According to still another aspect, the word line located at the lowermost end among the plurality of word lines may be spaced apart from the remaining word lines by a distance greater than a distance between the remaining word lines except for the word line located at the lowermost end among the plurality of word lines.

According to an embodiment, an erase operation method of a three-dimensional flash memory having a structure in which a Ground Selection Line (GSL) is removed by including a plurality of word lines which are formed by extending in a horizontal direction on a substrate and are sequentially stacked and a plurality of strings passing through the plurality of word lines and formed by extending in one direction on the substrate, each of the plurality of strings including a channel layer formed by extending in the one direction and a charge storage layer formed by extending in the one direction to surround the channel layer, and the channel layer and the charge storage layer constituting a plurality of memory cells corresponding to the plurality of word lines, and the channel layer including a back gate formed by extending in the one direction while at least a part thereof is surrounded by the channel layer and an insulation film formed by extending in the one direction between the back gate and the channel layer, the erase operation method includes grounding remaining word lines except for a word line located at the lowermost end among the plurality of word lines; and performing an erase operation on the plurality of strings by applying a Gate-Induced Drain Leakage (GIDL) voltage for causing GIDL phenomenon to the word line located at the lowermost end, at least one String Selection Line (SSL) located above the plurality of word lines, bit lines of a plurality of strings, and a common source line (CSL).

Advantageous Effects of the Invention

The embodiments provide a 3D flash memory to which a GSL removal structure is applied and an operating method thereof, thereby securing channel potential in a non-selected string, solving a channel leakage current, and improving memory integration.

BEST MODE

Hereinafter, embodiments will be described with reference to the accompanying drawings. However, it will be understood that the inventive concept is by no means restricted or limited in any manner by these embodiments. In addition, the same reference numeral shown in each drawing indicates the same component.

In addition, terminologies used in the present specification are used to properly express preferred embodiments of the inventive concept, and may be changed depending on the intention of users or operators, or customs in the field to which the inventive concept belongs. Accordingly, definitions of these terminologies should be made based on the content throughout this specification.

Figure 3A:
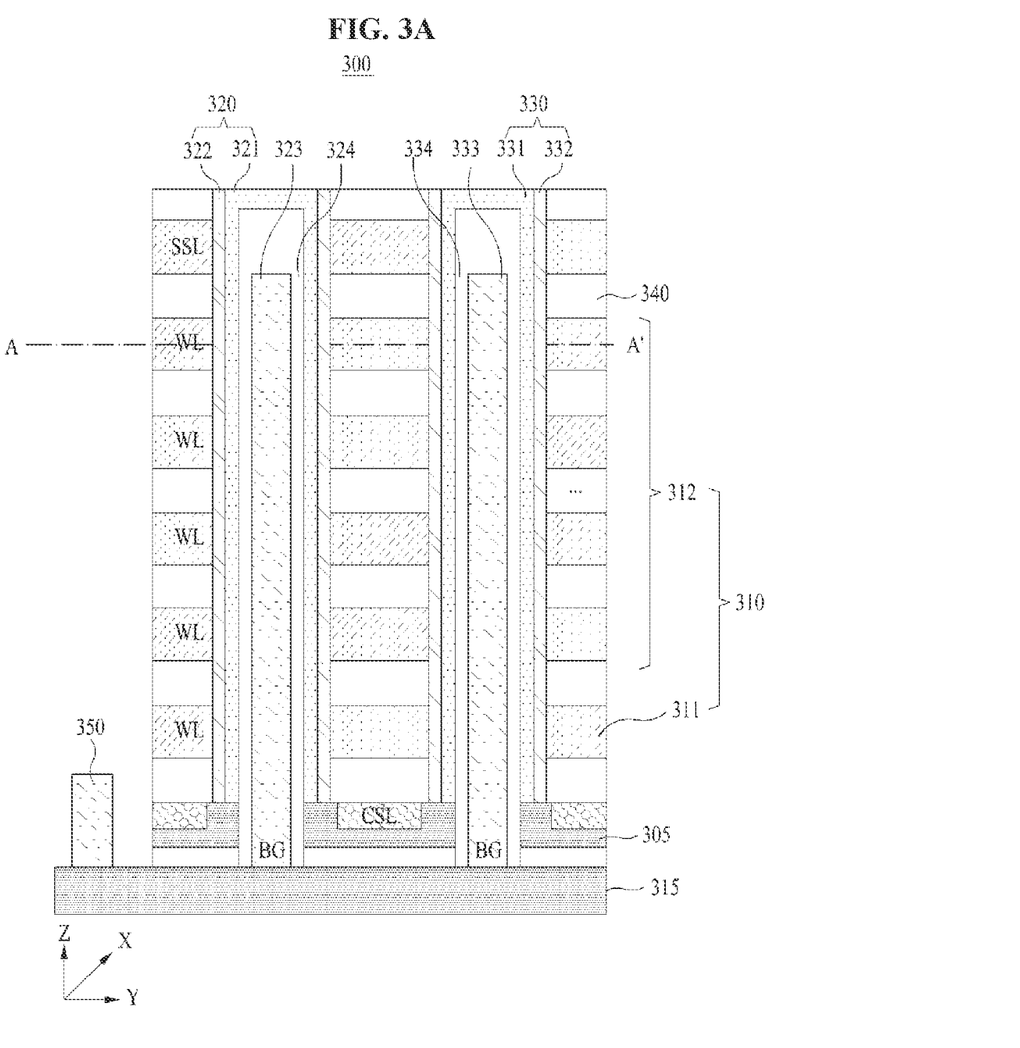
FIG. 3A is a Y-Z cross-sectional view of a three-dimensional flash memory according to an embodiment.
Figure 3B:
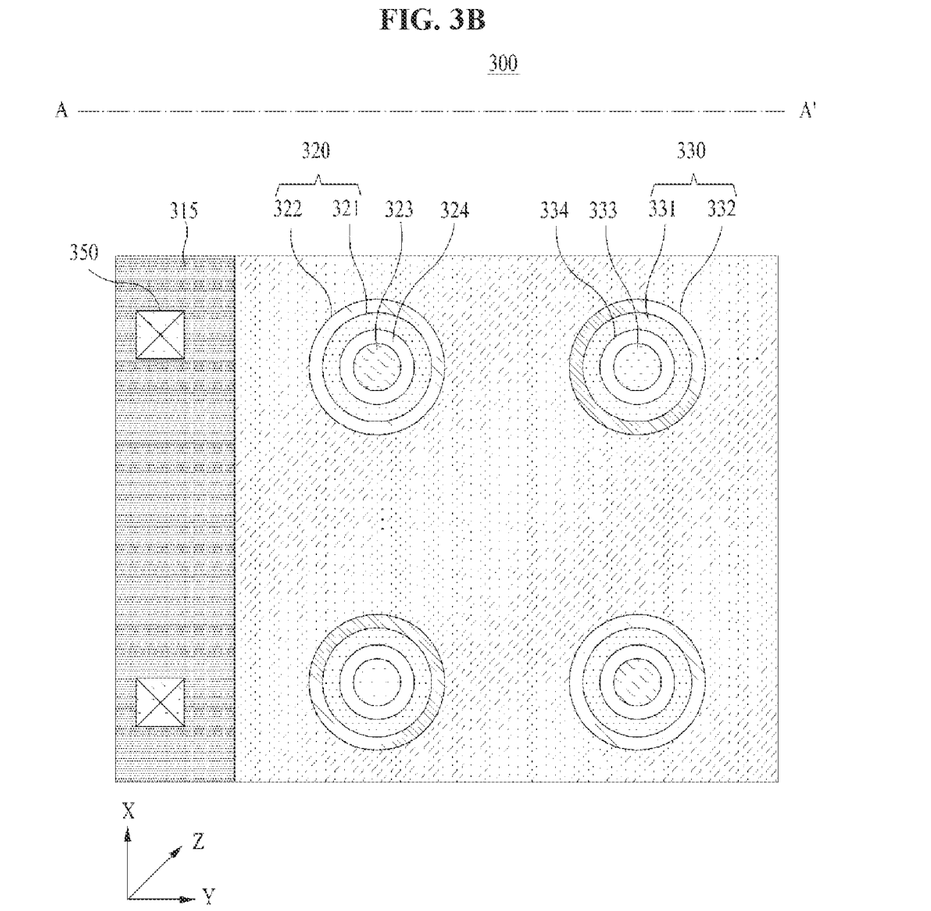
FIG. 3B is an X-Y plan view of an A-A' cross-section of the 3D flash memory shown in FIG. 3A.
Figure 4:
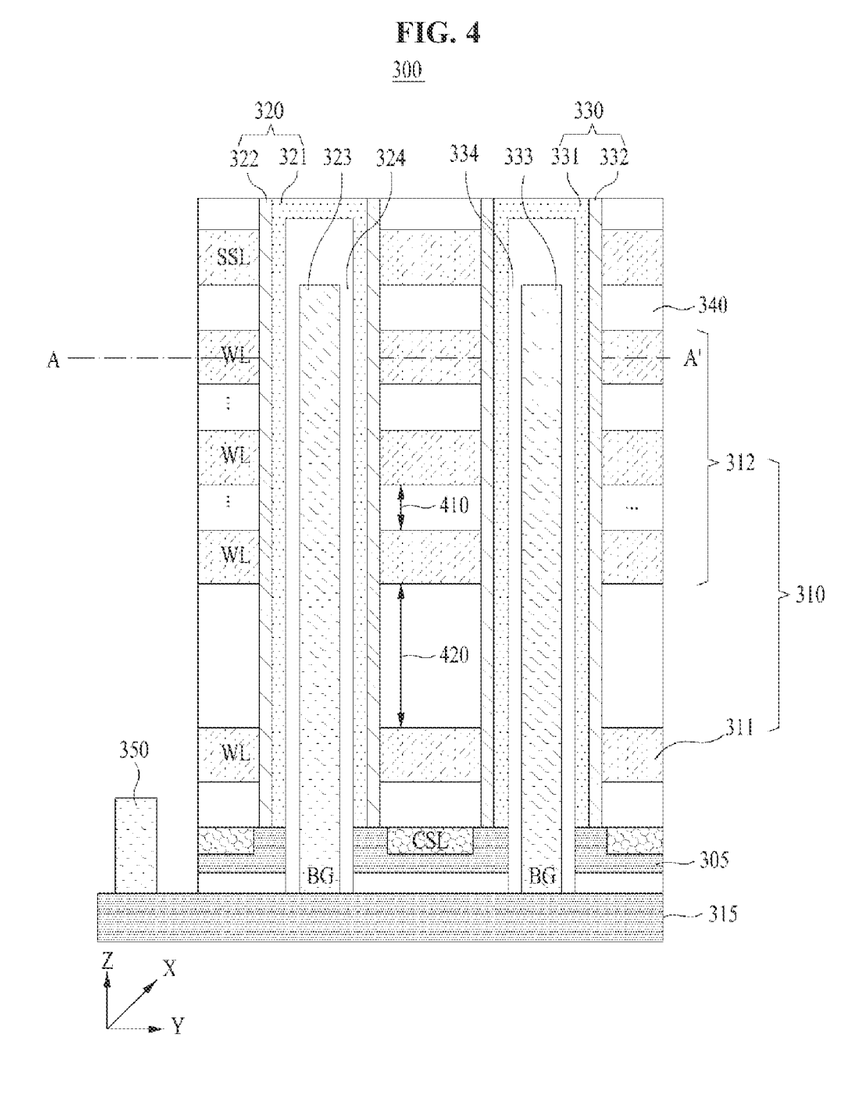
FIG. 4 is a Y-Z cross-sectional view of a 3D flash memory according to another embodiment.
Figure 5A:
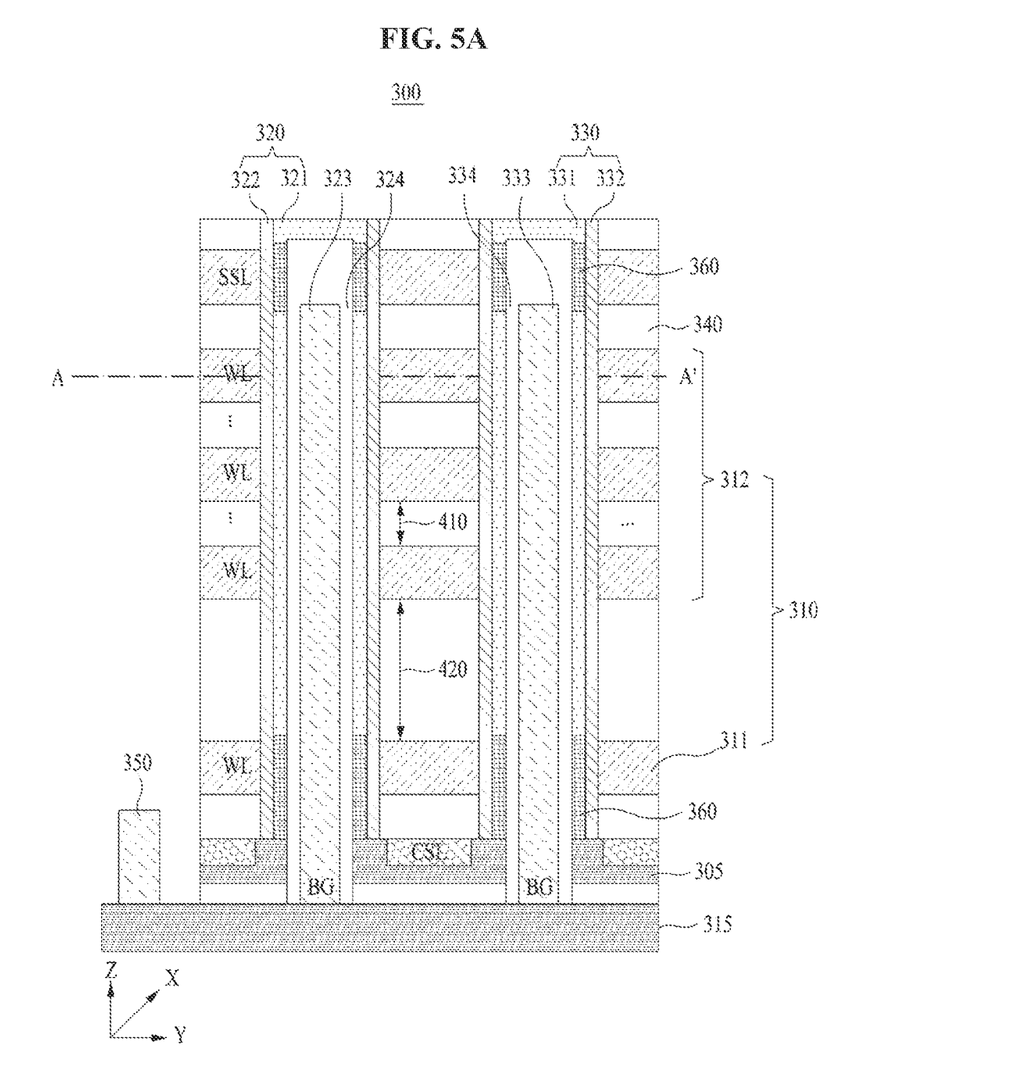
FIGS. 5A and 5B are Y-Z cross-sectional views of a 3D flash memory according to still another embodiment.
Figure 5B:
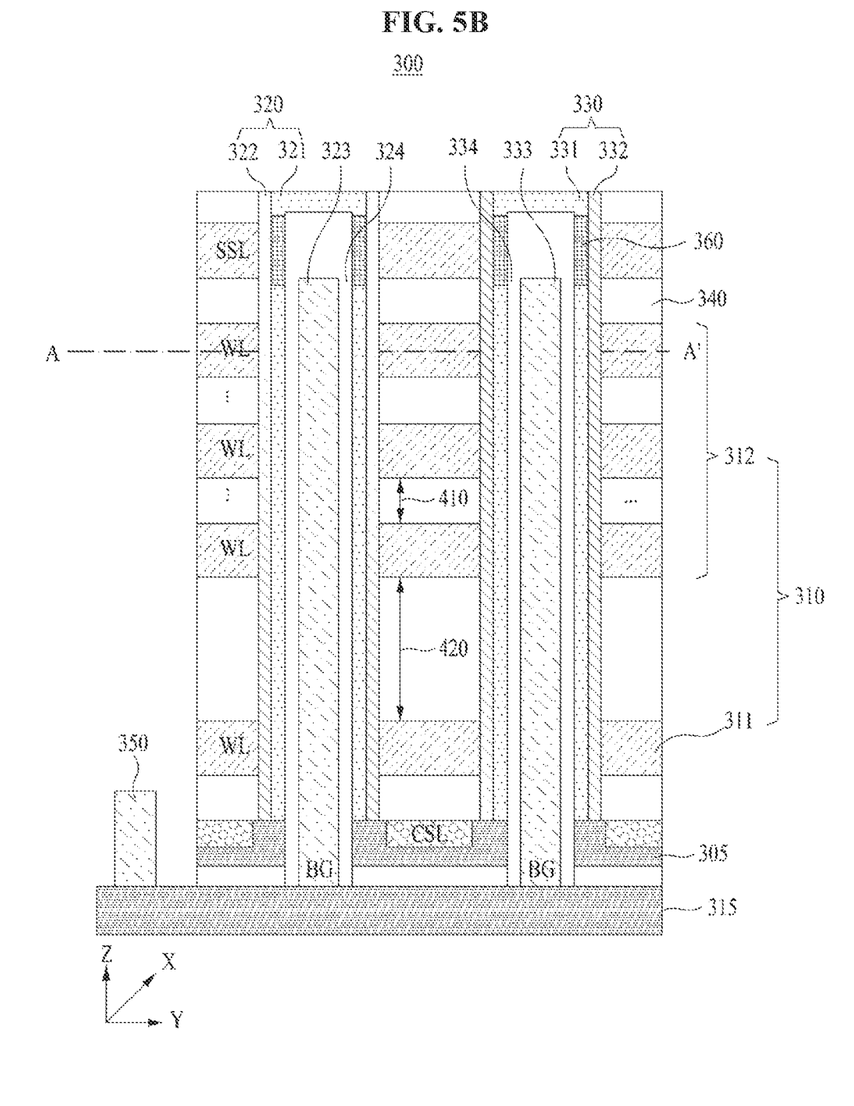

FIG. 3A is a Y-Z cross-sectional view of a 3D flash memory according to an embodiment, FIG. 3B is an X-Y plan view of an A-A' cross-section of the 3D flash memory shown in FIG. 3A, FIG. 4 is a Y-Z cross-sectional view of a 3D flash memory according to another embodiment, and FIGS. 5A and 5B are Y-Z cross-sectional views of a 3D flash memory according to still another embodiment.

Referring to FIGS. 3A and 3B, a 3D flash memory 300 according to an embodiment may include a plurality of word lines 310 and a plurality of strings 320 and 330.

The plurality of word lines 310 may be sequentially stacked while being formed by extending in the horizontal direction (e.g., Y direction) on a substrate 305, and each of the plurality of word lines 310 may be formed of a conductive material such as W (tungsten), Ti (titanium), Ta (tantalum), Cu (copper), Mo (molybdenum), Ru (ruthenium), or Au (gold) (including all metal materials capable of forming ALD in addition to the metal material described above) and may apply a voltage to memory cells corresponding thereto to enable a memory operation (hereinafter, the memory operation includes a read operation, a program operation, and an erase operation) to be performed. A plurality of insulating layers 340 formed of an insulating material may be interposed between the plurality of word lines 310.

Here, at least one string selection line (SSL) may be disposed over the plurality of word lines 310, and a common source line (CSL) may be formed under the plurality of word lines 310 on the substrate 305.

The plurality of strings 320 and 330 may be formed by extending in one direction (e.g., Z direction) on the substrate 305 while passing through the plurality of word lines 310 to, each of which may include channel layers 321 and 331 and charge storage layers 322 and 332.

The charge storage layers 322 and 332 may be components that trap charges or holes due to a voltage applied through the plurality of word lines 310, or maintain the states of the charges (e.g., a polarization states of the charges) while extending to surround the channel layers 321 and 331, and may be divided into regions corresponding to the plurality of word lines 310 and constitute a plurality of memory cells together with the channel layers 321 and 331 to serve as a data storage in the 3D flash memory 300. For example, an Oxide-Nitride-Oxide (ONO) layer or a ferroelectric layer may be used as the charge storage layers 322 and 332.

The channel layers 321 and 331 may be components that transfer charges or holes to the charge storage layers 322 and 332 by a voltage applied through the plurality of word lines 310, the at least one SSL, and a bit line and may be formed of monocrystalline silicon or polysilicon. In addition, the channel layers 321 and 331 may serve to transfer charges or holes to the charge storage layers 322 and 332 by a voltage applied through back gates 323 and 333 to be described later. A detailed description related thereto will be described below.

The channel layers 321 and 331 may include the back gates 323 and 333 extending in one direction (e.g., Z direction) while being at least partially surrounded by the channel layers 321 and 331, and insulating films 324 and 334 extending in one direction between the back gates 323 and 333 and the channel layers 321 and 331. Hereinafter, at least a portion of the back gates 323 and 333 being surrounded by the channel layers 321 and 331 may mean that the back gates 323 and 333 are included in at least a portion of the channel layers 321 and 331 or passing through the channel layers 321 and 331.

The back gates 323 and 333 may be formed of a conductive material such as W (tungsten), Ti (titanium), Ta (tantalum), Cu (copper), Mo (molybdenum). Ru (ruthenium), or Au (gold) (including all metal materials capable of forming ALD in addition to the metal material described above) or doped polysilicon, and may extend over inner regions corresponding to the plurality of word lines 310 in the channel layers 321 and 331. However, the back gates 323 and 333 is not limited thereto, and may extend over regions corresponding to the plurality of word lines 310 and a region corresponding to the at least one SSL in the channel layers 321 and 331.

In addition, the back gates 323 and 333 may extend to a substrate 315 for the back gates 323 and 333 positioned under the substrate 305 while passing through the substrate 305 on which the plurality of strings 320 and 330 are formed to extend. That is, the 3D flash memory 300 including the back gates 323 and 333 may have a double substrate structure.

In the double substrate structure, the lower substrate 315 may be used for heat dissipation of the plurality of strings 320 and 330. As the heat dissipation paths of the plurality of strings 320 and 330 are located on the substrate 315 separate from the substrate 305 on which the plurality of strings 320 and 330 are formed to extend, the heat dissipation paths of the plurality of strings 320 and 330 are formed on the substrate 305 on which the plurality of strings 320 and 330 are formed to extend, solving a problem in which the cell transistors are affected.

However, the 3D flash memory 300 including the back gates 323 and 333 may have a single substrate structure without being limited thereto. In this case, the back gates 323 and 333 may extend over the inner regions corresponding to the plurality of word lines 310 in the channel layers 321 and 331 on the substrate 305 on which the plurality of strings 320 and 330 are formed to extend, or extend over the regions corresponding to the plurality of word lines 310 in the channel layers 321 and 331 on the substrate 305 on which the plurality of strings 320 and 330 are formed to extend.

In addition, the 3D flash memory 300 including the back gates 323 and 333 may further include a back gate plate 325 passing through the substrate 305 and disposed in a horizontal direction under the substrate 305 in a single substrate structure including only the substrate 305 on which the plurality of word lines 310 are stacked and the plurality of strings 320 and 330 are formed to extend in one direction. The back gate plate 325 may be formed of the same material as the back gates 323 and 333, and serve to reduce the film stress of the plurality of word lines 310 to prevent warpage of the substrate 305. In the structure, the back gates 323 and 333 may extend to the back gate plate 325.

In both the single substrate structure and the double substrate structure, wring lines 350 for voltages applied to the back gates 323 and 333 may be formed on an upper surface of the substrate 315 connected to the back gates 323 and 333. However, the wiring lines 350 for the voltage applied to the back gates 323 and 333 may be formed on the lower surface of the substrate 315 connected to the back gates 323 and 333 (not shown) or be formed on the back gates 323 and 333, without being limited or restricted to the drawings.

The back gates 323 and 333 may be used to receive a voltage for changing and maintaining the state of the charges of the charge storage layers 322 and 332 (e.g., to trap, store, and maintain charges in the charge storage layers 322 and 332 by applying a voltage to the charge storage layers 322 and 332 through the channel layers 321 and 331) in the memory operation (e.g., program operation, erase operation and read operation) of the 3D flash memory 300. Accordingly, the voltage applied to the back gates 323 and 333 may enable a memory operation of the 3D flash memory 300 along with a voltage applied to the plurality of word lines 310 and voltages applied to the plurality of bit lines (not shown) respectively connected to the plurality of strings 320 and 330. The 3D flash memory 300 according to an embodiment may further use the back gates 323 and 333 together with the plurality of word lines 310 and the plurality of bit lines in the memory operation to solve the memory operating current to increase the memory operating speed, thereby improving cell characteristics and reliability.

In this case, the back gates 323 and 333 may have a structure in which the strings 320 and 330 are electrically separated in block units such that different voltages are applied to grouped block units, but are not limited or restricted thereto, and may have a structure that is electrically separated for each string so that different voltages can be applied to each other.

The insulating films 324 and 334 may be formed of an insulating material to prevent the back gates 323 and 333 from directly contacting the channel layers 321 and 331.

The 3D flash memory 30) including the above-described back gates 323 and 333 may boost a non-selected string (hereinafter, the non-selected string refers to a string including no target memory cell, which is a target of a memory operation, among the plurality of strings 320 and 330) through the back gates 323 and 333, avoiding a necessity to block a channel leakage current and thus avoiding necessity to include a ground selection line (GSL). That is, the 3D flash memory 300 according to an embodiment is characterized by having a structure in which the GSL is removed because each of the plurality of strings 320 and 330 includes the back gates 323 and 333.

As described above, as the 3D flash memory 300 has the structure in which the GSL is removed, the 3D flash memory 300 may use the word line 311 located at the lowermost end among the plurality of word lines 310 as a part of memory cell word lines like the word lines 312 except for the word line 311 located at the lowermost end or as a dummy word line that implements some of the functions which the existing GSL is in charge of. That is, the word line 311 positioned at the lowermost end may constitute a dummy word line or may constitute a part of memory cell word lines.

At this time, the word line 311 located at the lowermost end may be maintained in the On state at all times unlike the GSL included in an existing 3D flash memory which is selectively turned on/off during the memory operation process of the 3D flash memory. More specifically, the word line 311 located at the lowermost end may be used identically to the rest of the word lines 312 in program and read operations among memory operations, and may be used as a dummy word line in erase operations, so that the word line 311 may be maintained in the on state because a GISL (Gate-Induced Drain Leakage) voltage causing GISL phenomenon is applied. In the program operation, when the word line 311 is the word line of a target memory cell that is the target of the program operation, a program voltage Vpgm for the program operation may be applied to the word line 311 located at the lowermost end and when the word line 311 is not the word line of a target memory cell, the word line 311 located at the lowermost end may be floated. In the read operation, when the word line 311 is the word line of a target memory cell that is the target of the read operation, a read voltage Vread for the read operation may be applied to the word line 311 located at the lowermost end, which is a target of the read operation, and when the word line 311 is not the word line of the target memory cell, a pass voltage Vpass may be applied to the word line 311.

As described above, the 3D flash memory 300 may secure a channel potential in the non-selected string, solve a channel leakage current and improve memory integration by applying a GSL removal structure in which the word line 311 located at the lowermost end is used as a dummy word line or a part of memory cell word lines.

Detailed descriptions for the program operation, the read operation, and the erase operation included in memory operations will be described with reference to FIGS. 6 to 9 below.

Here, the word line 311 located at the lowermost end may be spaced apart from the rest of the word lines 312 by a distance 420 greater than a distance 410 between the word lines 312 other than the word line 311 located at the lowermost end among the plurality of word lines 310 as shown in FIG. 4.

In addition, a hole supply film 360 for supplying holes in an erase operation may be disposed in an area corresponding to the word line 311 located at the lowermost end of each of the plurality of strings 320 and 330, as shown in FIGS. 5A to 5B. Similarly, the hole supply film 360 for supplying holes in an erase operation may be disposed in an area corresponding to at least one String Selection Line (SSL) in each of the plurality of strings 320 and 330.

However, the present disclosure is not limited thereto, and as shown in FIG. 5B, the hole supply film 360 may be disposed only in an area corresponding to at least one String Selection Line (SSL) rather than disposed in areas corresponding to the word lines 311 located at the lowermost ends of the plurality of strings 320 and 330.

Figure 7:
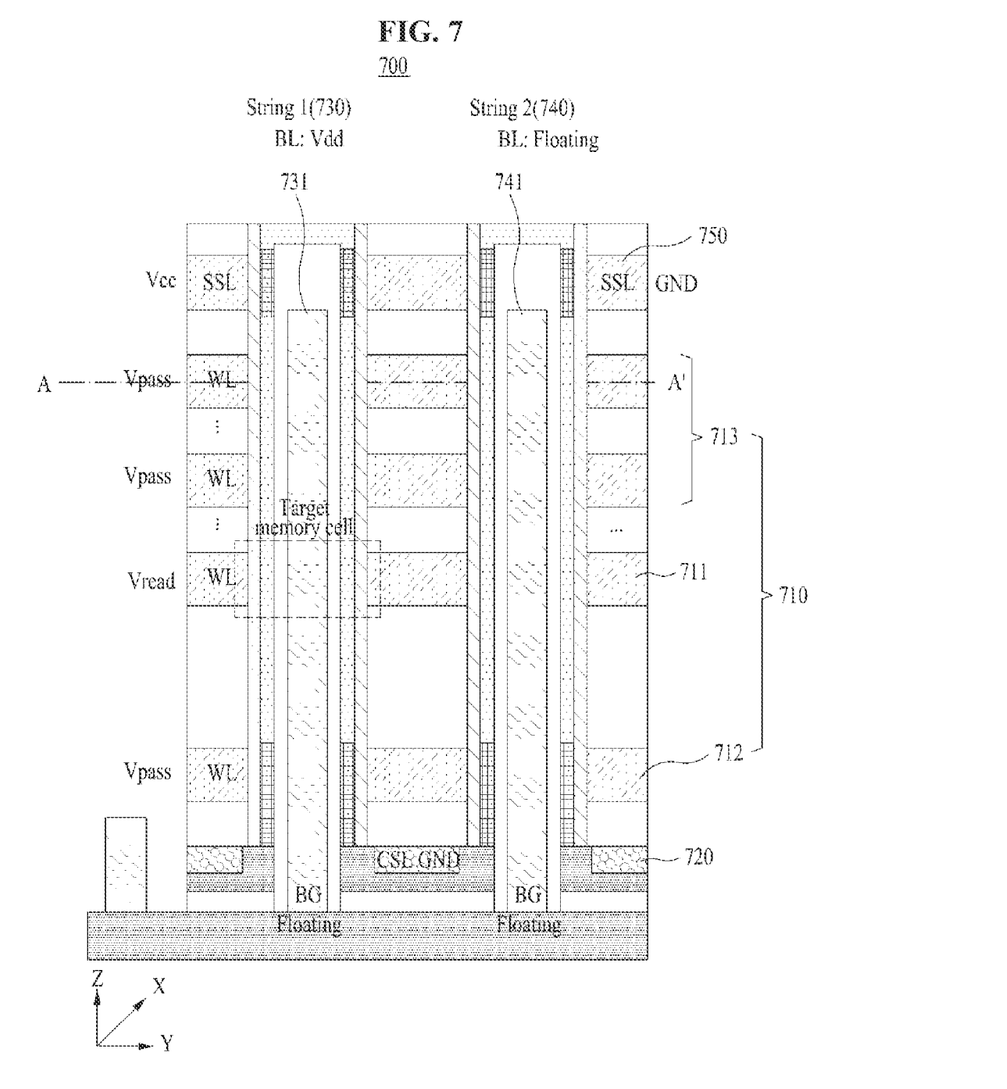
FIG. 7 is a Y-Z cross-sectional view showing a 3D flash memory to describe a read operation method of a 3D flash memory according to an embodiment.
Figure 8:
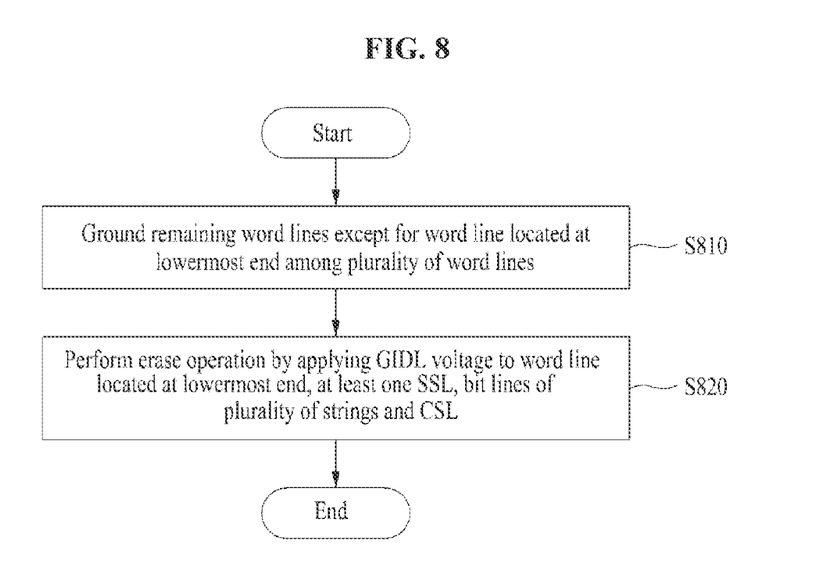
FIG. 8 is a flowchart illustrating an erase operation method of a 3D flash memory according to an embodiment.
Figure 9:
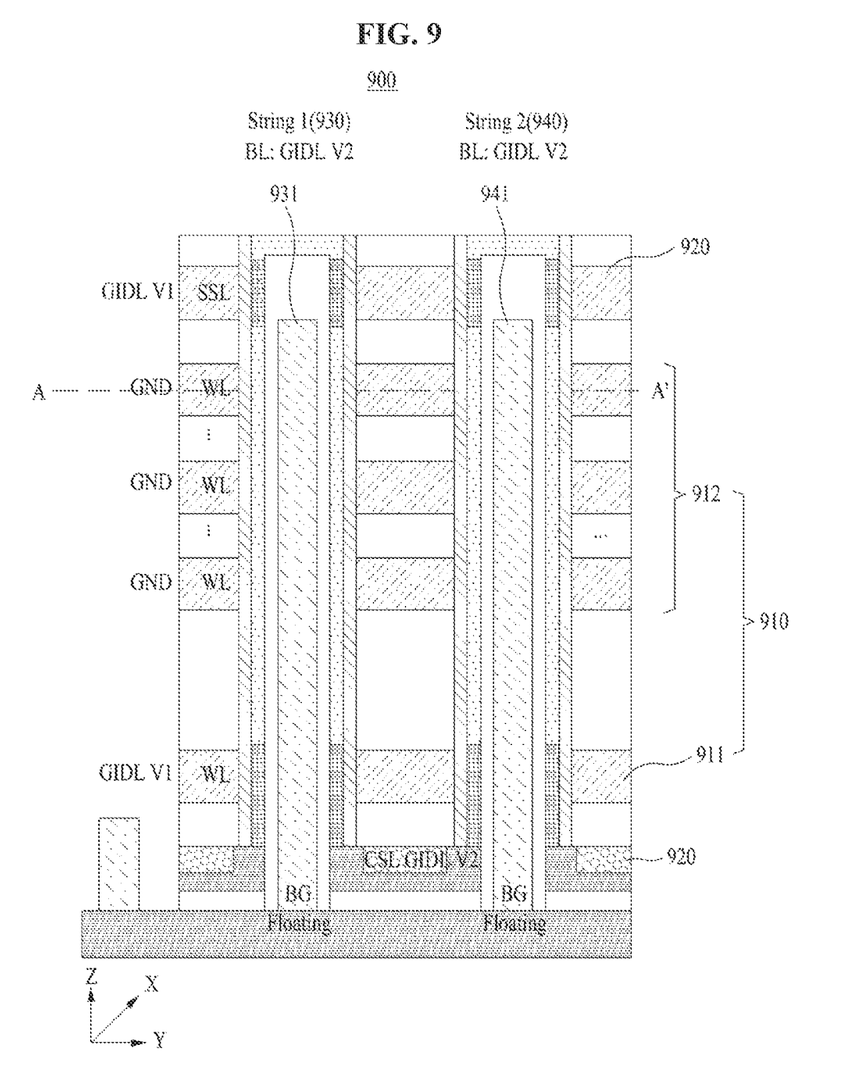
FIG. 9 is a Y-Z cross-sectional view showing a 3D flash memory to describe the erase operation method shown in FIG. 8.

Hereinafter, a program operation method described with reference to FIG. 6, a read operation method described with reference to FIG. 7, and an erase operation method described with reference to FIGS. 8 and 9 are assumed that they are performed by a three-dimensional flash memory with the structure described with reference to FIG. 5A. However, the present disclosure is not limited or restricted thereto. The memory operation method, the program operation method, the read operation method, and the erase operation method may also be performed by the three-dimensional flash memory with the described structure described with reference to FIGS. 3A to 3B, the structure described with reference to FIG. 4, or the structure described with reference to FIG. 5B.

Figure 6:
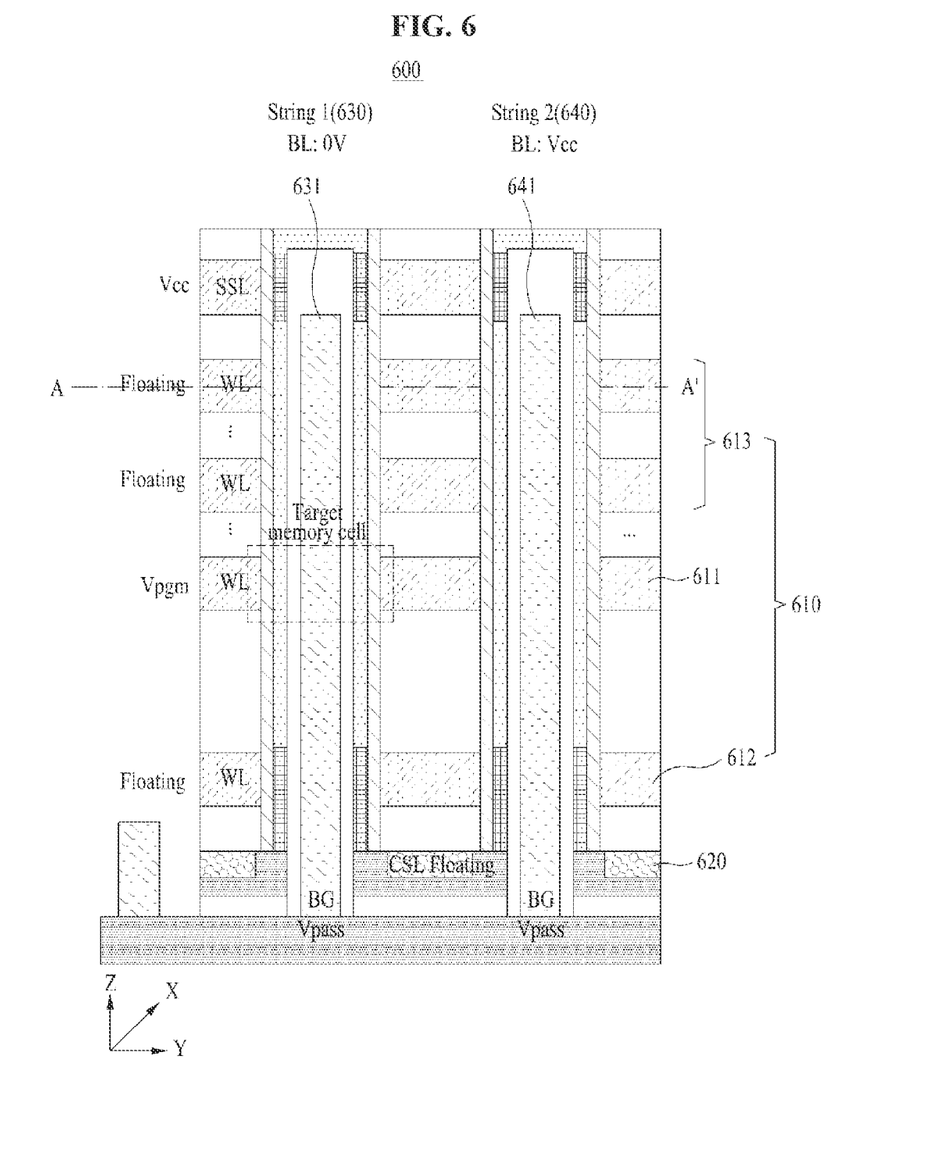
FIG. 6 is a Y-Z cross-sectional view showing a 3D flash memory to describe a program operation method of a 3D flash memory according to an embodiment.

FIG. 6 is a Y-Z cross-sectional view showing a 3D flash memory to describe a program operation method of a 3D flash memory according to an embodiment.

Referring to FIG. 6, a 3D flash memory 600 may apply a program voltage Vpgm to a target word line 611 corresponding to a target memory cell subject to a program operation, among a plurality of word lines 610, and float remaining word lines 613 including a word line 612 located at the lowermost end.

Thereafter, the 3D flash memory 600 may float a CSL 620, apply a voltage to a bit line of a selected string 630 including a target memory cell and a bit line of a non-selected string 640 including no target memory cell, apply a power voltage Vcc to at least one SSL 650 positioned on the plurality of word lines, and apply a voltage for a program operation to back gates 631 and 641 of each of a plurality of strings 630 and 640 to perform the program operation for the target memory cell.

For example, as shown in the drawing, the 3D flash memory 600 may apply a voltage of 0V to a bit line of the selected string 630, apply a power supply voltage Vcc to a bit line of the non-selected string 640, apply the power voltage Vcc to the at least one SSL 650 and apply the pass voltage Vpass to the back gates 631 and 641, thus performing the program operation for a target memory cell.

As described above, the program operation according to an embodiment is based on a method in which a pass voltage is applied to the back gates 631 and 641 rather than to a word line, so that the pass voltage is not applied to the word lines 613 corresponding to at least one remaining memory cell except for the target memory cell, preventing disturbance phenomenon caused by the pass voltage being applied to the word line. In addition, because the disturbance phenomenon is prevented, program operation characteristics may be improved to improve cell characteristics and reliability, and the speed at which a channel is formed in a channel layer of a selected string may be increased.

The program operation of the 3D flash memory 600 may use the word line 612 located at the lowermost end as a part of memory cell word lines, and may be performed when the word line 612 located at the lowermost end is not a word line of the target memory cell subject to the program operation. When the word line 612 located at the lowermost end is a word line of the target memory cell subject to the program operation, the program voltage Vpgm may be applied to the word line 612 located at the lowermost end like a conventional method.

As described above, the 3D flash memory 600 may improve memory integration by applying the GSL removal structure.

FIG. 7 is a Y-Z cross-sectional view showing a 3D flash memory to describe a read operation method of a 3D flash memory according to an embodiment.

Referring to FIG. 7, a 3D flash memory 700 may apply the read voltage Vread to a target word line 711 corresponding to a target memory cell, which is a target of a read operation, among a plurality of word lines 710 and apply the pass voltage Vpass to remaining word lines 713 including a word line 712 located at the lowermost end.

Thereafter, the 3D flash memory 700 may ground a CSL 720, apply a voltage to a bit line of a selected string 730 including a target memory cell and a bit line of a non-selected string 740 including no target memory cell, apply a voltage Vcc to at least one SSL 750 positioned on the plurality of word lines, and float a voltage for a program operation to back gates 731 and 741 of each of a plurality of strings 730 and 740 to perform the read operation for the target memory cell.

For example, the 3D flash memory 700 may apply a drain voltage Vdd to a bit line for the selected string 730, apply the power voltage Vcc to the at least one SSL 750, and float the back gate 731, at the same time, float a bit line for the non-selected string 740, ground the at least one SSL 750 and float the back gate 741, thereby performing a read operation on a target memory cell.

The read operation of the 3D flash memory 700 may use the word line 712 located at the lowermost end as a part of memory cell word lines, and may be performed when the word line 712 located at the lowermost end is not a word line of the target memory cell subject to the read operation. When the word line 712 located at the lowermost end is a word line of the target memory cell subject to the program operation, the read voltage Vread may be applied to the word line 712 located at the lowermost end like a conventional method.

As described above, the 3D flash memory 700 may improve memory integration by applying the GSL removal structure.

FIG. 8 is a flowchart illustrating an erase operation method of a 3D flash memory according to an embodiment, and FIG. 9 is a Y-Z cross-sectional view showing a 3D flash memory to describe the erase operation method shown in FIG. 8.

Referring to FIGS. 8 and 9, a 3D flash memory 900 may ground remaining word lines 912 except for a word line 911 located at the lowermost end among a plurality of word lines 910 in step S810.

Thereafter, in step S820, the 3D flash memory 900 may perform an erase operation for a plurality of strings 930 and 940 by applying a GIDL voltage for causing a GIDL phenomenon to the word line 911 located at the lowermost end among the plurality of word lines 910, at least one string selection line (SSL) 920, bit lines of the plurality of strings 930 and 940, and a CSL 950.

Specifically, as shown in the drawing, the 3D flash memory 900 may apply a first GIDL voltage (GIDL V1) to the word line 911 located at the lowermost end, apply a second GIDL voltage (GIDL V2) to the bit lines of the strings 930 and 940 and the CSL 950 and float back gates 931 and 941 of each of the plurality of strings 930 and 940, thereby performing an erase operation for the plurality of strings 930 and 940.

In the erase operation described above, the plurality of strings 930 and 940 are included in one block that is a unit of the erase operation, and strings included in another block may be maintained in their states regardless of the erase operation.

Such an erase operation of the 3D flash memory 900 may be to use the word line 911 located at the lowermost end as a dummy word line.

As described above, the 3D flash memory 900 may improve memory integration by applying the GSL removal structure.

Although the embodiments have been described by the limited embodiments and the drawings as described above, various modifications and variations are possible to those skilled in the art from the above description. For example, the described techniques may be performed in a different order than the described method, and/or components of the described systems, structures, devices, circuits, etc. may be combined or combined in a different form than the described method, or other components, or even when replaced or substituted by equivalents, an appropriate result can be achieved.

Therefore, other implementations, other embodiments, and equivalents to the claims are within the scope of the following claims.

The invention claimed is:

1. A three-dimensional flash memory comprising:
a plurality of word lines which are formed by extending in a horizontal direction on a substrate and are sequentially stacked; and
a plurality of strings passing through the plurality of word lines and formed by extending in one direction on the substrate, wherein each of the plurality of strings comprises a channel layer formed by extending in the one direction and a charge storage layer formed by extending in the one direction to surround the channel layer, and the channel layer and the charge storage layer constitute a plurality of memory cells corresponding to the plurality of word lines, and the channel layer comprises a back gate formed by extending in the one direction while at least a part thereof is surrounded by the channel layer and an insulation film formed by extending in the one direction between the back gate and the channel layer,
wherein the three-dimensional flash memory has a structure in which aground selection line (GSL) is removed as each of the plurality of strings includes the back gate.

2. The three-dimensional flash memory of claim 1, wherein a word line located at a lowermost end among the plurality of word lines forms a part of a dummy word line or memory cell word lines.

3. The three-dimensional flash memory of claim 2, wherein the word line located at the lowermost end among the plurality of word lines is in an ON state at all times during memory operation when being used as the dummy word line.

4. The three-dimensional flash memory of claim 2, wherein the word line located at the lowermost end among the plurality of word lines is supplied with a program voltage for a program operation when the word line is a word line of a target memory cell that is a target of the program operation during the program operation of the 3D flash memory, is floated when the word line is not the word line of the target memory cell subject to the program operation during the program operation, is supplied with a Gate-Induced Drain Leakage (GIDL) voltage for causing a GIDL phenomenon during an erase operation of the 3D flash memory, is supplied with a read voltage for a read operation when the word line is a word line of a target memory cell subject to the read operation and is supplied with a pass voltage when the word line is not the word line of the target memory cell subject to the read operation.

5. The three-dimensional flash memory of claim 2, wherein, in the word line located at the lowermost end among the plurality of word lines, a hole supply film for supplying holes in an erase operation is disposed.

6. The three-dimensional flash memory of claim 5, wherein, in an area corresponding to at least one String Selection Line (SSL) located above the plurality of word lines in each of the plurality of strings, the hole supply film for supplying the holes in the erase operation is disposed.

7. The three-dimensional flash memory of claim 2, wherein the word line located at the lowermost end among the plurality of word lines is spaced apart from remaining word lines by a distance greater than a distance between the remaining word lines except for the word line located at the lowermost end among the plurality of word lines.

8. An erase operation method of a three-dimensional flash memory having a structure in which a Ground Selection Line (GSL) is removed by including a plurality of word lines which are formed by extending in a horizontal direction on a substrate and are sequentially stacked and a plurality of strings passing through the plurality of word lines and formed by extending in one direction on the substrate, each of the plurality of strings including a channel layer formed by extending in the one direction and a charge storage layer formed by extending in the one direction to surround the channel layer, and the channel layer and the charge storage layer constituting a plurality of memory cells corresponding to the plurality of word lines, and the channel layer including a back gate formed by extending in the one direction while at least a part thereof is surrounded by the channel layer and an insulation film formed by extending in the one direction between the back gate and the channel layer, the erase operation method comprising:
grounding remaining word lines except for a word line located at a lowermost end among the plurality of word lines; and
performing an erase operation on the plurality of strings by applying a Gate-Induced Drain Leakage (GIDL) voltage for causing GIDL phenomenon to the word line located at the lowermost end, at least one String Selection Line (SSL) located above the plurality of word lines, bit lines of a plurality of strings, and a common source line (CSL).

* * * * *